United States Patent [19]

Schreck et al.

[11] Patent Number: 4,797,857

[45] Date of Patent: Jan. 10, 1989

[54] ARRAY DISCHARGE FOR BIASED ARRAY

[75] Inventors: John F. Schreck, Houston; Timmie M. Coffman; David D. Wilmoth, both of Sugar Land, all of Tex.

[73] Assignee: Texas Instruments Incorporated, Dallas, Tex.

[21] Appl. No.: 850,636

[22] Filed: Apr. 11, 1986

[51] Int. Cl.$^4$ .............................................. G11C 7/00
[52] U.S. Cl. ..................................... 365/203; 365/104; 365/226
[58] Field of Search ............... 365/189, 203, 226, 104

[56] References Cited

U.S. PATENT DOCUMENTS 4,319,344  3/1982  Heuber et al. ..................... 365/203
4,321,489  3/1982  Higuchi et al. ................. 365/226 X
4,651,302  3/1987  Kimmel et al. .................... 365/104

Primary Examiner—Joseph A. Popek
Attorney, Agent, or Firm—John G. Graham; Rodney M. Anderson

[57] ABSTRACT

A discharge circuit for discharging bit lines of an array of semiconductor memory cells in which the array of bit lines are biased from a single bias line. The discharge circuit includes a discharge switch coupled to the bias line for discharging the bit lines and the bias line and a control circuit coupled to the discharge switch operative to turn on the discharge switch in response to the voltage on the bias line rising above a first predetermined level and then to turn off the discharge switch in response to the voltage on the bias line falling below a second predetermined level.

8 Claims, 2 Drawing Sheets

ARRAY DISCHARGE FOR BIASED ARRAY

FIELD

The present invention relates to a discharge circuit for discharging the capacitance of the bit lines of a biased array of electrically programmable read only memory cells (EPROMS) formed in a face of semiconductor substrate.

BACKGROUND

In a conventional method of biasing EPROMS and ROMS a reference signal was used to drive independent bit-line drivers. An improved system described in our copending application Ser. No. 786,991 filed on Oct. 15, 1985 utilizes one large supply voltage VBIAS for biasing both the array sources and the array bit-lines through pass transistors. Among other advantages the latter scheme removes the dependence of bit line bias voltage on the individual threshold voltages ($V_T$'s) of the bit line drivers in the conventional scheme. However, during the program inhibit phase following the end of programming, the entire array could be charge up to at least 10 volts. This charge must be discharged before a subsequent read mode can be entered into. The length of time taken for this discharge by the ordinary bleeder resistive path attached to the bias line considerably limits the speed unless an alternative faster method of discharge is provided.

Accordingly, it is an object of the present invention to provide a circuit which more rapidly discharges the array bit lines and the bias line than can be accomplished with a bleeder resistor.

SUMMARY OF THE INVENTION

According to the invention there is provided a discharge circuit for discharging an array of bit lines in an array of semiconductor memory cells in which the bit lines are biased from a single bias line. The discharge circuit includes a discharge switch coupled to the bias line for discharging the array of bit lines and the bias line substantially faster than the discharge time of the array of bit lines and voltage bias line without the discharge switch. A control circuit coupled to the discharge switch is operative to turn on the discharge switch in response to the voltage on the voltage bias line rising above a first predetermined level and then to turn off the discharge switch in response to the voltage on the bias line falling below a second predetermined level.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
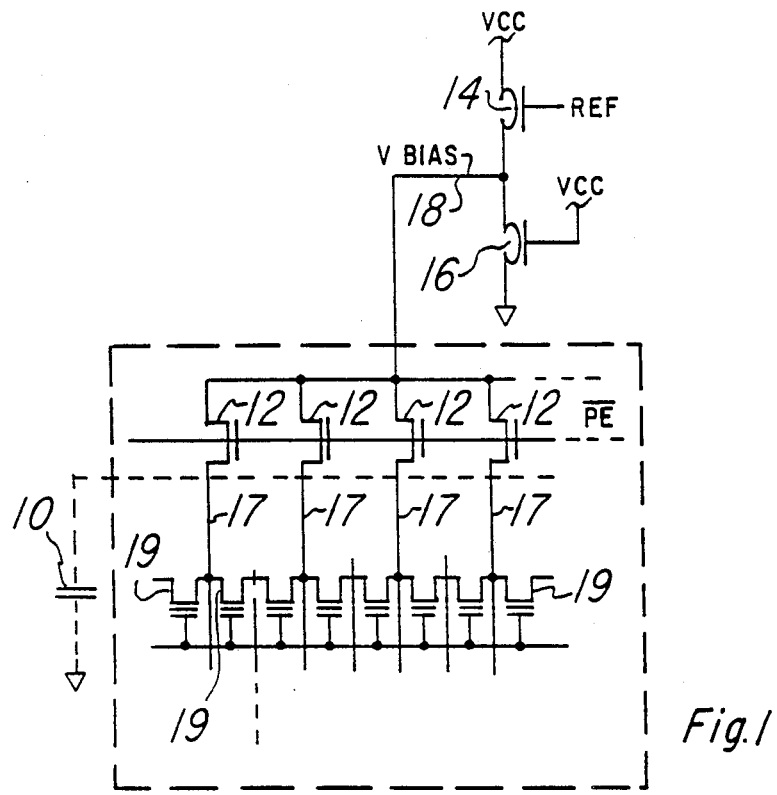
FIG. 1 is an equivalent circuit diagram of a bit line bias arrangement in which the bit lines are biased from a single bias line through pass transistors.

Referring to FIG. 1, there is shown an equivalent circuit of an array of electrically programmable memory cells 19 including biasing the array of bit lines 17 from a single bias line (VBIAS) 18 without any provision made for speeding up the discharge of the bit lines 17 following programming. Typically the large capacitance 10 associated with these bit lines 17 is charged up to about 10 volts. During a program inhibit (PE) phase pass transistor 12 which represents all of the separate bit line pass transistors is turned on by a positive gate signal of $V_{cc}$ which is typically 6 volts. This turning on of pass transistor 12 allows the charging up of VBIAS line 18 to $V_{cc}-V_T$ or about 4.5 volts from a normal value of about 1.5 volts as set by a reference voltage REF of about 3.0 volts less the $V_T$ of transistor 14. Thus, transistor 14 becomes non-conducting while the voltage level of VBIAS is about 1.5 volts. The only means of discharging the array bit line capacitance 10 is the bleeder transistor 16 which must be small enough during READ mode to merely bleed charge from bias line 18. Transistor 16 must also be large enough to establish the desired voltage on VBIAS line 18 without consuming too much power and to keep transistor 14 out of a high impedance region thereby helping to stabilize the bias voltage over different read conditions. However, the high resistance equivalence of transistor 16 means that the discharge time of the array bit line capacitance 10 is relatively slow.

Figure 2:
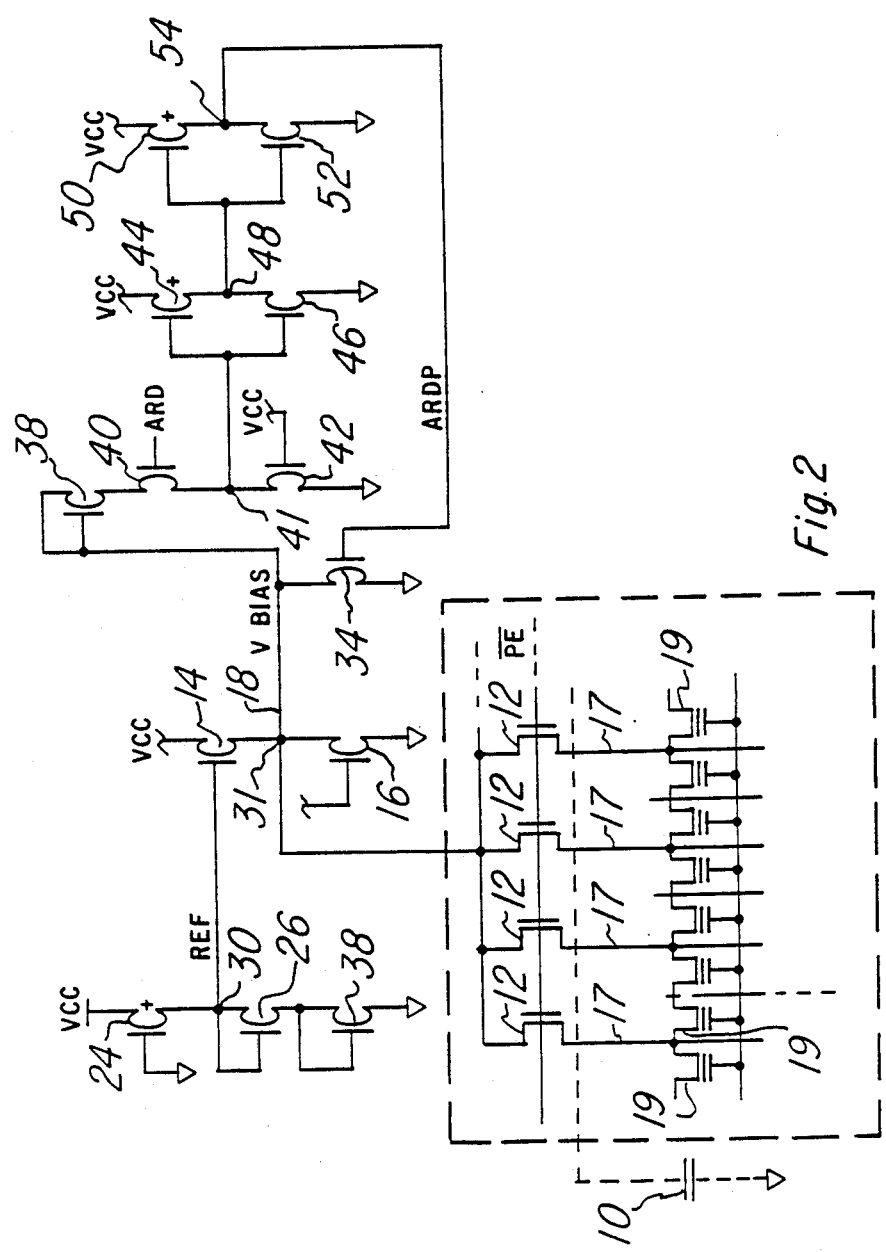
FIG. 2 is a circuit diagram of a bit line bias arrangement in which a discharge circuit according to a preferred embodiment of the invention is incorporated.

A circuit which enhances the speed of discharge of capacitance 10 over that with transistor 16 alone is shown in FIG. 2. The reference voltage REF is generated by P-channel transistor 24 in series with transistors 26 and 28. Transistor 24 merely supplies current from $V_{cc}$ to transistors 26 and 28 which each drop a $V_T$ in voltage due to their thresholds, or about 3.0 volts in all. Transistor 14 due to the 3.0 volts on its gate passes only $3.0-V_T$ or about 1.5 volts onto VBIAS line 18. The means by which a rapid discharge of the bias line and, hence capacitance 10, is achieved is to utilize discharge transistor 34 between VBIAS line 18 and ground. By arranging for transistor 34 to be substantially larger than transistor 16 and turning it on only for the amount of time needed to discharge capacitance 10 a considerable improvement in speed of operation is obtained over that with the circuit of FIG. 1.

The driving circuitry of transistor 34 consists of transistor 38 which is equivalent to a diode in series with a resistance coupling VBIAS line 18 with the source to drain path of pass transistor 40. Transistor 40 is gated by an ARD signal. The other end of the source to drain path of transistor 40 is coupled to a junction 41. Transistor 42 also coupled to junction 41 is a relatively small transistor which bleeds charge from junction 41 and ensures that the voltage of junction 41 drops low whenever the ARD signal level is low. Junction 41 is coupled to the gates of both P-channel transistor 44 and N-channel transistor 46 which form an inverter and whose source to drain paths are in series between $V_{cc}$ and ground and which are connected at junction 48. Transistor 44 is substantially smaller than transistor 46 and therefore merely acts as a load for the latter and lowers the trip point of the inverters to about 1.5 volts. Thus, when junction 41 goes high, junction 48 will be drawn low. Junction 48 is coupled to the gates of P-channel transistor 50 and to that of N-channel transistor 52. The latter transistors form an inverter as do transistors 44 and 46. The output of the former transistors on junction 54 is fed to the gate of transistor 34.

Figure 3:
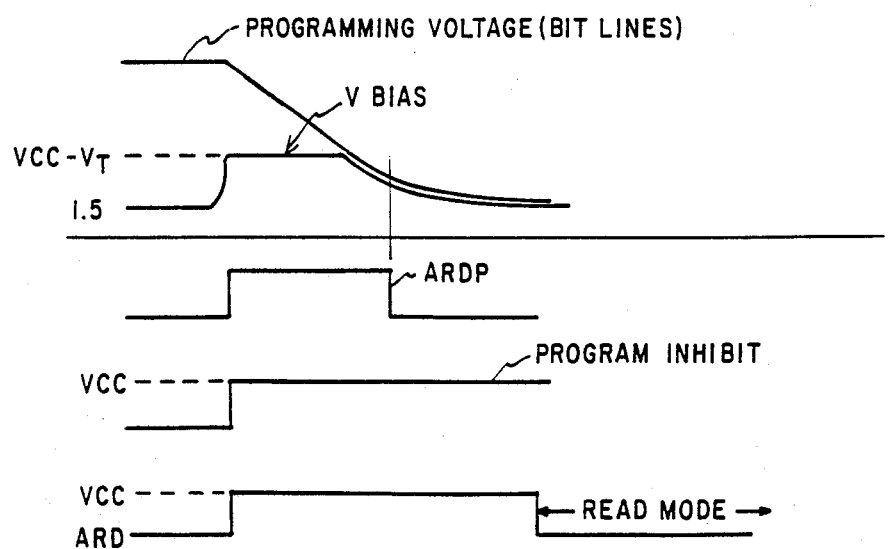
FIG. 3 is a timing diagram of various control waveforms used in the circuits of FIGS. 1 and 2.

In operation, referring to the timing diagrams of FIG. 3, once the array programming voltage is removed, the $\overline{PE}$ signal goes high to $V_{cc}$ charging up VBIAS line 18 to about 4.5 volts. Transistor 16 begins to bleed off charge from VBIAS line 18 which is supplied through pass transistor 12 from array capacitance 10. The ARD signal goes high turning on transistor 40 and pulling up junction 41 to about 3.0 volts. This turn on transistor 48 which pulls junction 48 to ground. The low voltage on junction 48 turns off transistor 52 and turns on P-channel transistor 50 putting $V_{cc}$ onto junction 54 and turning on transistor 34. The array capacitance 10 discharges through transistor 12, VBIAS line 18 and discharge transistor 34 (in parallel with transistor 16) to ground. Once capacitance 10 discharges to $V_{cc}-V_T$ or about 4.5 volts both the voltage across capacitance 10 and that on VBIAS line 18 fall together towards ground. On reaching about 1.5 volts above the voltage on junction 41, transistor 42 then discharges junction 41 to a point where transistor 46 no longer conducts. At this point the voltage on line 54 drops to ground and turns off discharge transistor 34. VBIAS line thereafter discharges more slowly through bleeder transistor 16 towards 1.5 volts. Subsequently, the ARD signal on the gate of transistor 40 goes low ensuring the cut off of transistor 40 and a READ mode is entered into.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A discharge circuit for discharging bit lines of an array of semiconductor memory cells in which the bit lines are biased from a common bias line, comprising:
    a discharge switch coupled to said bias line for discharging said bit lines and said bias line; and
    a control circuit coupled to said discharge switch operative to turn on said discharge switch in response to the voltage on said bias line rising above a first predetermined level and then to turn off said discharge switch in response to the voltage on said bias line falling below a second predetermined level.

2. A discharge circuit according to claim 1, wherein said control circuit includes a control switch having a predetermined threshold voltage and reversibly switchable from an off state in which it turns off said discharge switch to an on state in which it turns on said discharge switch, responsive to an input voltage to said control switch crossing said predetermined threshold voltage.

3. A discharge circuit according to claim 2, wherein said control switch includes:
    a diode coupled to said bias line; and
    a driver having an input coupled to said diode and an output coupled to said discharge switch such that upon the input of said driver rising above said predetermined threshold voltage, said driver generates a high signal level that turns on said discharge switch and upon dropping below said predetermined threshold voltage, said driver generates a low output signal that turns off said discharge switch.

4. A discharge circuit according to claim 3, wherein said discharge switch is a field effect transistor.

5. A discharge circuit according to claim 3, wherein said driver includes:
    a first inverter having an N-channel transistor coupled to ground and a P-channel transistor coupled between said N-channel transistor source to drain path and $V_{cc}$ with the input of said driver being the gate of the N-channel transistor connected to the gate of said P-channel transistor, said first inverter having an output at the junction of said N-channel transistor and said P-channel transistor; and
    a second inverter having an input coupled to said output of said first inverter, the output of said second inverter being the output of said driver;
    wherein said N-channel transistor in said first inverter is substantially larger than said P-channel transistor therein.

6. A discharge circuit according to claim 5, wherein said first and second predetermined levels are substantially the same.

7. A method of discharging the bit lines of an array of semiconductor memory cells in which the bit lines are biased from a common bias line, comprising:
    switching on a discharge switch connected between said bias line and ground in response to the voltage on said bias line rising above a first predetermined level; and
    turning off said discharge switch when the voltage on said bias line falls below a second predetermined level.

8. A method according to claim 7, wherein said discharge switch is a field effect transistor.

* * * * *